United States Patent [19]

Zwernemann

[11] 3,907,617

[45] Sept. 23, 1975

[54] MANUFACTURE OF A HIGH VOLTAGE SCHOTTKY BARRIER DEVICE

[75] Inventor: Ross Zwernemann, Phoenix, Ariz.

[73] Assignee: Motorola, Inc., Chicago, Ill.

[22] Filed: Dec. 7, 1973

[21] Appl. No.: 422,942

Related U.S. Application Data

[62] Division of Ser. No. 191,672, Oct. 22, 1971, Pat. No. 3,821,772.

[52] U.S. Cl. .................. 148/188; 148/187; 357/15; 148/175

[51] Int. Cl.$^2$ .......................................... H01L 7/34

[58] Field of Search ............... 148/188, 187; 357/15

[56] References Cited

UNITED STATES PATENTS

| | | | |
|---|---|---|---|
| 3,463,971 | 8/1969 | Soshea et al. | 357/15 |
| 3,513,366 | 5/1970 | Clark | 148/187 X |
| 3,541,403 | 11/1970 | Lepselter et al. | 148/175 X |
| 3,764,413 | 10/1973 | Kakizaki et al. | 148/188 |

*Primary Examiner*—G. Ozaki
*Attorney, Agent, or Firm*—Vincent J. Rauner; Henry T. Olsen

[57] ABSTRACT

Providing a substrate doped with a first type of impurity and having a silicon dioxide ring deposited thereon which is doped with a second type of impurity. Treating the substrate to diffuse the impurities from the ring into the substrate immediately therebelow to form a guardring aligned with the aperture through the silicon dioxide ring. Depositing barrier and contact metals within the aperture of the silicon dioxide ring to form a Schottky barrier aligned with said guardring.

3 Claims, 7 Drawing Figures

MANUFACTURE OF A HIGH VOLTAGE SCHOTTKY BARRIER DEVICE

This is a Division of application Ser. No. 191,672, filed Oct. 22, 1971 and now U.S. Pat. No. 3,821,772, issued June 28, 1974.

BACKGROUND OF THE INVENTION

1. Field of the Invention

Schottky or surface barrier devices are formed by a metal-to-semiconductor interface. Theoretically, these devices are useful for a great variety of purposes, however, in their simplest form the reverse bias leakage current is three or four orders of magnitude higher than anticipated and the reverse bias breakdown voltage is less than one-third the theoretical value. These deficiencies in the operating characteristics are caused by current flowing across the edge portion of the barrier when the device is reverse biased. To reduce this edge current flow guardrings, such as described in U.S. Pat. No. 3,541,403, are formed in the semiconductor material in underlying relationship to the edge of the metal forming the Schottky barrier. The guardring is produced by diffusing impurities into the semiconductor material which provides a conductivity of a type opposite to the conductivity of the remainder of the semiconductor material. For example, the semiconductor material may be of the N type conductivity and the guardring will be of the P type conductivity.

The barrier ring is normally constructed so that a substantial portion thereof underlies the metal of the Schottky barrier. However, it has been found that there is a tendency for the metal and guardring to operate in conjunction with the oppositely doped semiconductor material as a low-grade semiconductor diode in parallel with the Schottky barrier. The semiconductor diode in parallel with the Schottky barrier greatly reduces the performance characteristics of the Schottky barrier, especially at high voltages and/or currents. To reduce this effect it is necessary to reduce the interface area between the barrier metal and the guardring.

2. Description of the Prior Art

In the prior art the interface area between the metal barrier and the guardring is reduced by means of a double diffused guardring structure. The double diffused guardring structure is described in detail in U.S. Pat. No. 3,513,366, entitled "High Voltage Schottky Barrier Diode" and issued to the same assignee. The double diffused guardring includes a semiconductive substrate of a first conductivity type having a guardring diffused therein to form a second conductivity type and a second guardring diffused into the first guardring and coaxial therewith to form a ring within the guardring of the first conductivity type. The major drawback of this structure is the difficulty in the manufacture thereof.

SUMMARY OF THE INVENTION

The present invention pertains to an improved method of forming a Schottky barrier device and guardring and the structure formed thereby wherein a semiconductor substrate of a first conductivity type has a first layer of insulating material formed thereon so as to define a central aperture, a second layer of silicon dioxide disposed over said first layer and a portion of the substrate exposed by the aperture and extending around the entire periphery of the aperture, the silicon dioxide of the second layer being doped with an impurity for providing conductivity of a type opposite to the conductivity of said substrate and the impurity being diffused from said silicon dioxide layer into the substrate immediately therebelow. By diffusing the impurity from the silicon dioxide into the semiconductor substrate, the impurity concentration in the guardring formed in the substrate is maintained relatively low and, because there is a greater tendency for the impurities to diffuse downwardly into the substrate, rather than horizontally, the width of the guardring is limited and the interface area of the barrier metal to the guardring is reduced.

It is an object of the present invention to provide an improved method of forming a Schottky barrier device and guardring.

It is a further object of the present invention to provide an improved Schottky barrier device and guardring.

It is a further object of the present invention to provide a Schottky barrier device wherein the interface area betwen the barrier metal and the guardring is substantially reduced with a single diffusion process.

It is a further object of the present invention to provide an improved Schottky barrier device and guardring wherein a low impurity concentration is automatically and simply produced by the improved diffusion technique.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
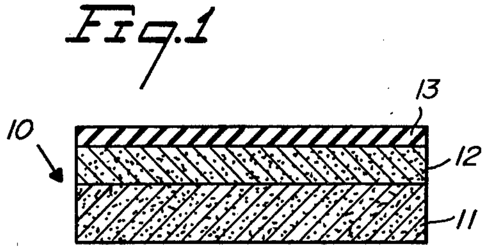
FIGS. 1 through 7 are cross-sectional views illustrating sequential steps performed during the manufacture of an improved Schottky barrier diode and guardring.
Figure 2:
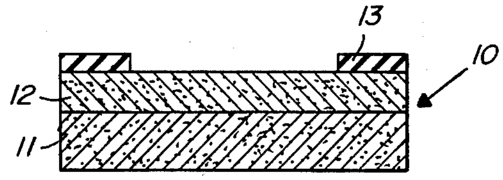

Referring to the figures, the numeral 10 generally designates a semiconductor substrate having a lower heavily doped layer 11 and an upper lightly doped layer 12. While the substrate 10 might be doped with impurities which produce either conductivity type (N or P) in the present embodiment the impurities are such as to produce an N type of conductivity. The upper surface of the lightly doped layer 12 of substrate 10 has a thin layer 13 of insulating material, such as silicon dioxide deposited thereon. Referring to FIG. 2, a central portion of the insulating layer 13 is etched or cut away to expose a portion of the upper surface of layer 12. For simplicity the substrate 10 will generally be formed in a circular configuration and the layer 13 forms a ring thereon extending from the outer periphery radially inwardly to define a coaxial centrally located aperture.

Figure 3:
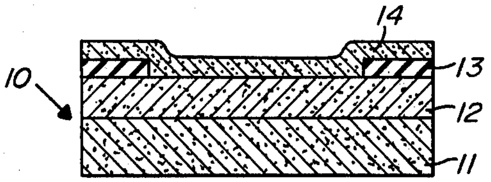
Figure 4:
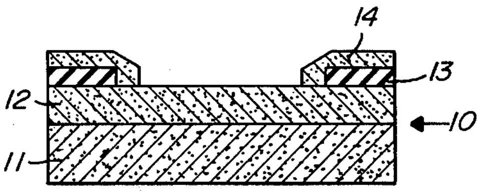

Referring to FIGS. 3 and 4, a layer 14 of silicon dioxide lightly doped with impurities for providing conductivity of a type opposite to the conductivity of the substrate 10, (which in this embodiment would be P type conductivity) is deposited over the layer 13 and the portion of the upper surface of layer 12 exposed by the aperture through the layer 13. An aperture is then formed in the layer 14 coaxial with the aperture in the layer 13 but slightly smaller in diameter. Thus, a small portion of the ring-shaped layer 14, adjacent the inner periphery, is engaged with the surface of the layer 12 of substrate 10 around the entire periphery of the aperture through the layer 13. The exact amount that the layer 14 overlaps the layer 13 in the central aperture thereof is not critical and is only limited by good production techniques and considerations.

Figure 5:
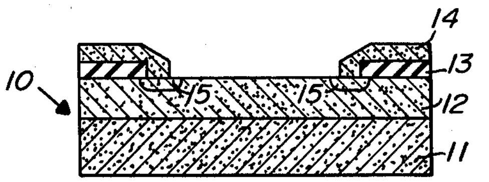
Figure 6:
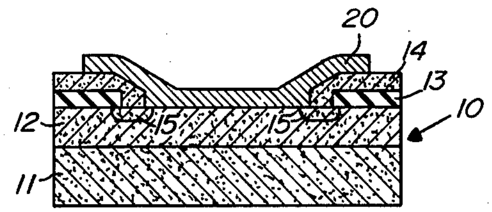
Figure 7:
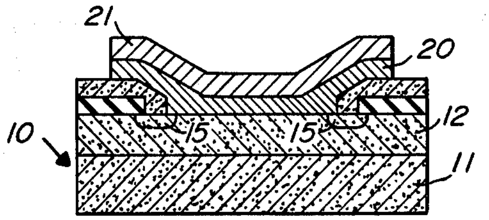

Referring to FIG. 5, the impurities in the layer 14 are diffused downwardly therefrom into the upper layer 12 of the substrate 10 immediately therebelow, as indicated at 15. These impurities are diffused from the layer 14 into the layer 12 by standard techniques, such as heating to a predetermined level for a specified period of time. The layer 14 is lightly doped with impurities and, consequently, a low impurity concentration is produced in the area designated by 15, which is generally referred to as a guardring. Since the substrate 10 is formed of N conductivity type semiconductor material and the layer 14 contained impurities which produced the opposite type conductivity, the guardring illustrated at 15 in a P conductivity type. Further, it is important to note that the impurities from the layer 14 diffuse generally downwardly into the substrate 10, rather than horizontally outwardly, so that there is a very small area of the guardring underlying the central aperture of the layer 14. It is believed that materials other than silicon dioxide may be doped lightly with impurities for providing conductivity of a type opposite to the conductivity of the substrate 10 and utilized to form layer 14 as described above. It is intended that any such use of materials other than those described herein which perform the functions of this invention are considered within the scope thereof.

A layer 20 of barrier and contact metals, such as molybdenum or the like, is deposited by well-known evaporation or sputtering techniques over a portion of the layer 14 and the exposed surface of the layer 12 within the aperture defined by the layer 14. The metal layer 20 forms a Schottky barrier with the exposed surface of the semiconductor material forming layer 12 and the guardring at area 15 underlies the edges of the barrier to relieve the electric field crowding therearound. A relatively thick metal layer 21 is deposited on the layer 20 to form an electrical contact therewith. The layer 20 will be constructed with the required thickness and of suitable material to provide the device known as a Schottky barrier and operating in a manner well known to those skilled in the art.

Thus, an improved method of forming a Schottky barrier device and guardring, as well as an improved Schottky barrier device, is disclosed wherein the diffusion into a substrate to form a guardring can be easily and accurately controlled as to the impurity concentration and the horizontal spreading or radial width of the ring. By controlling the radial width of the guardring the interface area between the barrier metal, layer 20, and the guardring, designated at 15, can be reduced substantially to greatly reduce the effect this interface has on the operation of the Schottky barrier device.

In the prior art methods of manufacturing Schottky barrier diodes with guardrings, the guardring is diffused into the substrate and the insulating layer is then deposited over the surface. An aperture must then be formed in the insulating layer which is accurately aligned with the guardring. The present method eliminates these steps since the aperture formed in the layer 14 simultaneously defines the periphery of the guardring 15 and the periphery of the barrier metal 20. Thus, the manufacturing process is simplified and rejects due to misaligned guardrings are greatly reduced or eliminated.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. An improved method of forming a Schottky barrier device and guardring comprising the steps of:

a. forming on a surface of a semiconductor substrate of a first conductivity type a first layer of insulating material and forming an aperture through said first layer to expose the surface of said substrate;
b. forming a second layer of silicon dioxide doped with an impurity for providing conductivity of a type opposite said first conductivity type over said first layer and the exposed surface of said substrate in the aperture through said first layer;
c. forming an aperture through said second layer within said aperture through said first layer to expose the surface of said substrate so that a portion of said second layer remains in contact with said substrate along the entire edge of the aperture;
d. diffusing the impurity of said second layer into the substrate beneath the portion of said second layer in contact with said substrate to form a guardring; and
e. applying barrier and contact metals to the exposed surface of the substrate in the aperture and a portion of the surface of said second layer surrounding the aperture.

2. An improved method as set forth in claim 1 wherein a lightly doped epitaxial layer is grown on a heavily doped layer and defines the surface of the substrate.

3. An improved method as set forth in claim 1 including the steps of forming the substrate into a circular disk and the first and second layers into concentric rings with the second layer extending radially inwardly slightly farther than said first layer.

* * * * *